United States Patent
Lim et al.

[19]

[11] Patent Number: 6,011,965
[45] Date of Patent: Jan. 4, 2000

[54] RECEIVER WITH A TUNABLE PARALLEL RESONANT CIRCUIT

[75] Inventors: Kui Y. Lim; Sok Y. Lee; Hwee H. Lau, all of Singapore, Singapore

[73] Assignee: U.S. Philips Corporation, New York, N.Y.

[21] Appl. No.: 08/999,318

[22] Filed: Dec. 29, 1997

[30] Foreign Application Priority Data

Dec. 30, 1996 [SG] Singapore ............................ 9611947-4

[51] Int. Cl.$^7$ .................................................... H04B 1/16
[52] U.S. Cl. ........................... 455/290; 455/293; 455/338
[58] Field of Search ............................ 455/193.1, 193.2, 455/192.3, 182.3, 191.2, 197, 280, 281, 283, 290, 293, 338; 348/731, 725; 330/306, 305, 178

[56] References Cited

U.S. PATENT DOCUMENTS

| | | | |
|---|---|---|---|
| 3,519,737 | 7/1970 | Marsh, Jr. .................................. | 178/5.8 |
| 3,646,449 | 2/1972 | Hellbarth et al. ........................ | 325/383 |
| 3,947,629 | 3/1976 | Tanaka et al. ........................... | 455/290 |
| 3,991,373 | 11/1976 | Maurer et al. ........................... | 455/290 |
| 4,288,875 | 9/1981 | Carter ...................................... | 455/197 |
| 4,297,643 | 10/1981 | Pearson, Jr. ............................. | 330/178 |
| 4,403,347 | 9/1983 | Iso et al. .................................. | 455/193 |
| 4,667,342 | 5/1987 | Lindenmeier et al. ................. | 455/293 |

FOREIGN PATENT DOCUMENTS

| | | |
|---|---|---|
| 1766492 | 3/1972 | Germany . |
| 3046843 | 7/1982 | Germany . |

*Primary Examiner*—Edward F. Urban
*Attorney, Agent, or Firm*—Edward W. Goodman

[57] ABSTRACT

In a receiver, a tunable parallel resonant circuit (PRC2) is coupled to an input (IN) of a transistor circuit (MOIC) via a coupling network (CNW). The coupling network (CNW) lacks a varicap diode but includes a coupling resistor (Rc) in series with a coupling capacitor (Cc). The coupling capacitor has a coupling capacitance which is within an order of magnitude of an input capacitance at the input of the transistor circuit and the impedances of the coupling capacitor and the coupling resistor are substantially equal at a lower end of a frequency range throughout which the tunable parallel resonant circuit is tunable

1 Claim, 2 Drawing Sheets

$$Cb = \frac{Z^2(Cc)}{Z^2(Cc) + Z^2(Rc)} \cdot Cc$$

RECEIVER WITH A TUNABLE PARALLEL RESONANT CIRCUIT

BACKGROUND OF THE INVENTION

1. Field of The Invention

The invention relates to a receiver comprising a tunable parallel resonant circuit which is coupled to an input of a transistor circuit via a coupling network including a coupling capacitor.

2. Description of The Related Art

Philips television (TV) tuners of the type UV816 include a tunable bandpass filter which can be tuned throughout the VHF-low band ranging, for example, from 48 to 168 MHz. The tunable bandpass filter is coupled between a radio-frequency (RF) input amplifier and a mixer circuit which forms part of an integrated circuit. It comprises two parallel resonant circuits which are mutually coupled. One of the two parallel resonant circuits is coupled to the RF input amplifier. The other resonant circuit is coupled to an input transistor of the mixer circuit via a coupling network including a coupling capacitor and a varicap diode of the type BB131. A tuning voltage is applied to the varicap diode so as to vary its capacitance throughout the VHF-low band.

In the background art, it is essential that the coupling network includes the varicap diode to which the tuning voltage is applied. If the varicap had not been present, the background-art tuner would have suffered from relatively poor signal-handling in terms of noise and gain. Moreover, the tunable parallel resonant circuit would not have been tuned sufficiently correctly throughout the relevant frequency band, which is the VHF-low band, as a result of a tracking error with an oscillator resonant circuit in the background-art tuner.

SUMMARY OF THE INVENTION

It is an object of the invention to provide a receiver of the subject type which, with respect to the background art, allows more cost-efficient implementations. To that end, a receiver, in accordance with the invention, comprising a tunable parallel resonant circuit which is coupled to an input of a transistor circuit via a coupling network including a coupling capacitor, is characterized in that the coupling network lacks a varicap diode but includes a coupling resistor which is coupled in series with the coupling capacitor.

The invention takes the following aspects into consideration. The transistor circuit should preferably "see" a source impedance which remains substantially constant while the tunable parallel resonant circuit is tuned. However, tunable parallel resonant circuits generally have a resonance-frequency impedance which substantially varies while they are tuned. The coupling network should therefore compensate the tuning dependency of the resonance-frequency impedance of the tunable parallel resonant circuits as satisfactorily as possible. If the coupling network fails to do so, the signal handling will suffer from this in terms of noise, gain and frequency characteristics.

In accordance with the invention, the coupling network lacks a varicap diode but includes a coupling resistor which is coupled in series with the coupling capacitor. The coupling resistor and the coupling capacitor, which are coupled in series, provide an equivalent bridging capacitance between the tunable parallel resonant circuit and the transistor circuit. This equivalent bridging capacitance varies as a function of frequency in the same sense as the way in which the varicap diode capacitance is made to vary by means of the tuning voltage in the background art. Consequently, the invention allows compensation of the tuning dependency of the resonance-frequency impedance of the tunable parallel resonant circuit, without the use of a varicap diode. Varicap diodes are relatively expensive, in particular, the varicap diode used in the background-art coupling network. Thus, the invention allows more cost-efficient implementations than the background art.

Moreover, the invention also allows implementations which, with respect to the background art, have a comparable performance. At first sight, this may seem strange because, in the invention, the coupling resistor is a potential source of noise which is placed right in a signal path. Therefore, one might expect a penalty in terms of noise performance. In most practical cases, the penalty will be relatively mild, because the resonance-frequency impedance of the tunable parallel resonant circuit will generally be sufficiently high with respect to the impedance of the coupling resistor, so as to prevent the coupling resistor from being a dominant noise source.

The invention and additional features, which may be optionally used to implement the invention to advantage, are apparent from and will be elucidated with reference to the drawings described hereinafter.

DESCRIPTION OF THE PREFERRED EMBODIMENTS

First, some remarks will be made on the use of reference signs. Similar entities will be denoted by an identical letter-code throughout the drawings. In a single drawing, various similar entities may be shown. In that case, a numeral will be added to the letter-code, to distinguish similar entities from each other.

Figure 1A:
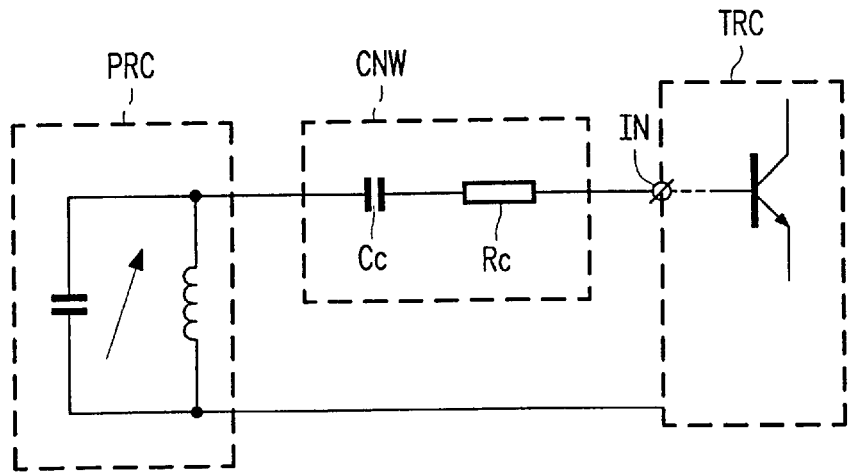
FIG. 1a is a diagram showing the basic principles of the invention.

FIG. 1a illustrates the basic principles of the invention. In FIG. 1a, a tunable parallel resonant circuit PRC is coupled to an input IN of a transistor circuit TRC via a coupling network CNW. The coupling network CNW includes a coupling capacitor Cc and a coupling resistor Rc which are coupled in series. However, the coupling network CNW lacks a varicap diode.

Figure 1B:
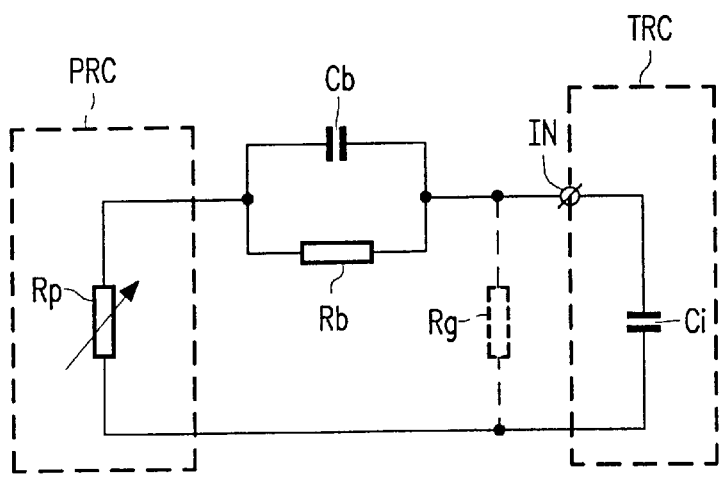
FIG. 1b is an equivalent circuit diagram for further explanation of the basic principles of the invention.

FIG. 1b is a circuit diagram which is equivalent to FIG. 1a. FIG. 1b shows a resonance-frequency impedance Rp of the tunable parallel resonant circuit PRC, an input capacitance Ci of the transistor circuit TRC and, in broken lines, a source impedance Rg "seen" by the transistor circuit TRC at the input IN. Furthermore, FIG. 1b shows a bridging resistance Rb and a bridging capacitance Cb. They are both coupled in parallel between the tunable parallel resonant circuit PRC and the input IN of the transistor circuit TRC. The parallel-coupled bridging resistance Rb and bridging capacitance Cb are the equivalents of the series-coupled coupling resistor Rc and coupling capacitor Cc shown in FIG. 1a.

The resonance-frequency impedance Rp is transformed to the source impedance Rg by means of the bridging capacitance Cb, the bridging resistance Rb, and the input capacitance Ci of the transistor circuit TRC. If the tunable parallel resonant circuit PRC is tuned to higher frequencies, the resonance-frequency impedance Rp will increase to a certain extent. However, the source impedance Rg will not increase to the same extent, or will even not increase at all. The reason for this is that the bridging capacitance Cb decreases with the frequency. This decrease compensates the increase of the resonance-frequency impedance Rp to a certain extent. Of course, the foregoing will apply inversely, if the tunable parallel resonant circuit PRC is tuned to lower frequencies. Thus, if the tunable parallel resonant circuit PRC is tuned, any variation in the source impedance Rg will be less than the variation in the resonance-frequency impedance Rp.

Figure 2:
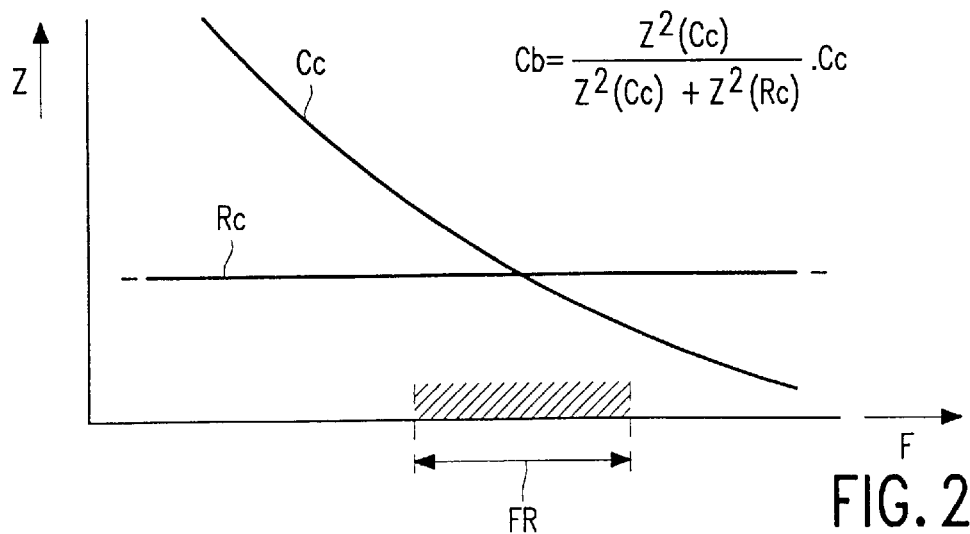
FIG. 2 is a diagram illustrating an additional feature which may be optionally used to implement the invention to advantage.

FIG. 2 illustrates the following additional feature. The coupling capacitor Cc has an impedance Z(Cc) which is lower than the impedance Z(Rc) of the coupling resistor Rc in at least a portion of a frequency range FR throughout which the tunable parallel resonant circuit can be tuned. FIG. 2 is an impedance (Z)-versus-frequency (F) graph having two curves denoted Cc and Rc. The curve denoted Cc shows the impedance Z(Cc) of the coupling capacitor Cc. The curve denoted Rc shows the impedance Z(Rc) of the coupling resistor Rc. The graph also shows a formula which expresses the bridging capacitance Cb as a function of the impedances Z(Cc) and Z(Rc) of the coupling capacitor Cc and the coupling resistor Rc, respectively.

The FIG. 2 feature is based on the following considerations. If the impedance Z(Cc) of the coupling capacitor Cc is lower than the impedance Z(Rc) of the coupling resistor Rc by at least an order of magnitude, the bridging capacitance Cb will vary in a way which is substantially inversely proportional to the square root with frequency. That is, if the frequency increases by a factor of 2, the bridging capacitance Cb will decrease by a factor of 2 to the square root, which is 4. In contradistinction, if the impedance Z(Cc) of the coupling capacitor Cc is higher than the impedance Z(Rc) of the coupling resistor Rc by at least an order of magnitude, the bridging capacitance Cb will vary as a function of frequency to a relatively small extent only. As a result, any variation in the resonance-frequency impedance Rp will be compensated to a relatively small extent too.

If the FIG. 2 feature is applied, the bridging capacitance Cb will vary as a function of frequency to an appreciable extent within the frequency range FR of interest. This allows the coupling network CNW to substantially compensate any variation in the resonance-frequency impedance Rp, so as to maintain the source impedance Rg at a relatively constant level throughout the frequency range FR of interest. If the latter is the case, a relatively good signal handling in terms of noise, gain and frequency characteristics will be achieved. Thus, the FIG. 2 feature contributes to good signal-handling.

Figure 3:
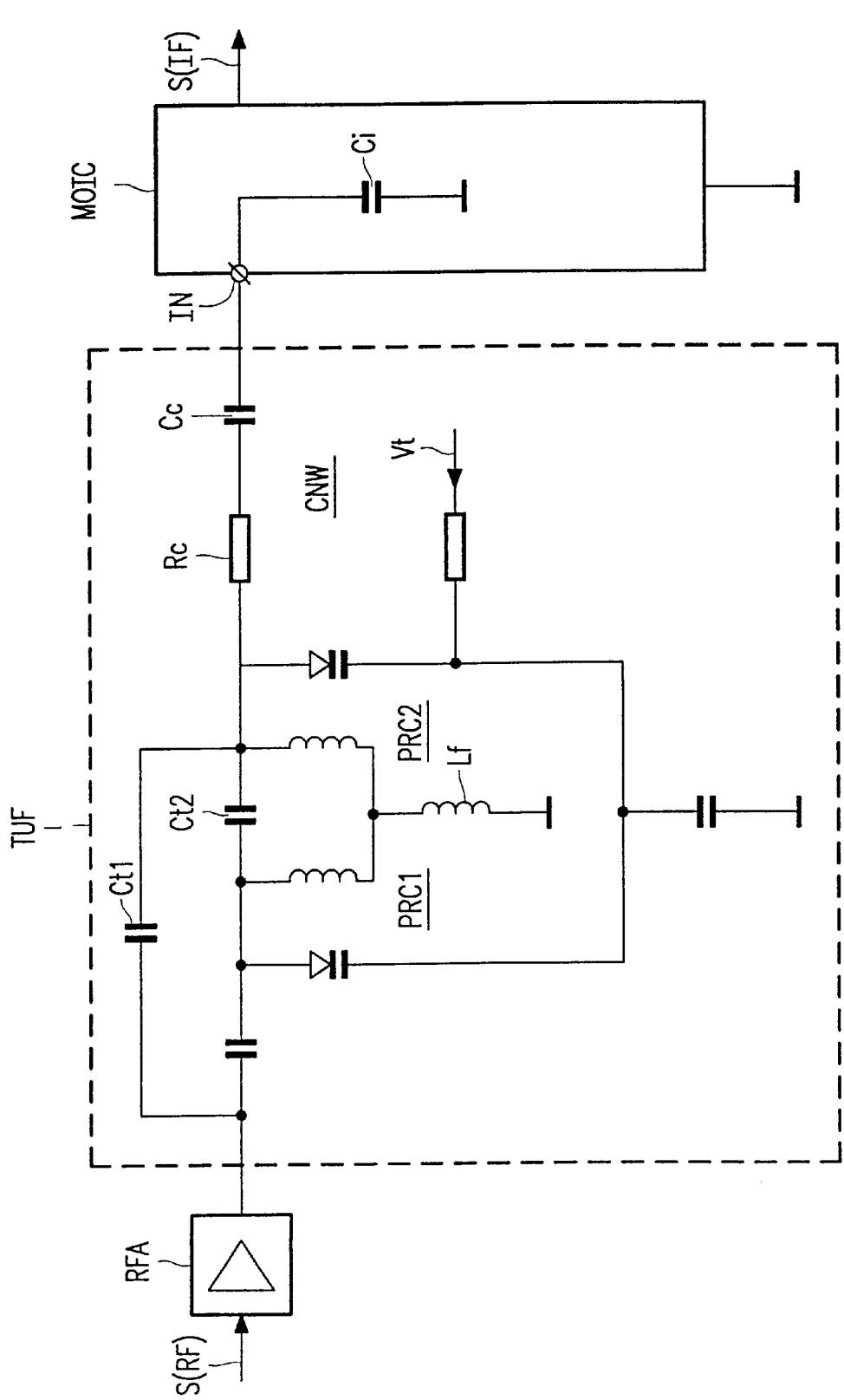
FIG. 3 is a circuit diagram of an example of a receiver in accordance with the invention.

FIG. 3 shows an example of a receiver in accordance with the invention. The FIG. 3 receiver receives a signal S(RF) at a radio frequency RF within the VHF-low band and converts it to a signal S(IF) at an intermediate frequency IF of, for example, 40 MHz. The receiver comprises an input amplifier RFA, a tunable filter TUF and a mixer-oscillator integrated circuit MOIC. Details of the input amplifier RFA, which may comprise a further tunable filter at its input, are not shown. For reasons of conciseness, external components of the integrated mixer-oscillator circuit MOIC are not shown either.

The tunable filter TUF includes two tunable parallel resonant circuits PRC1 and PRC2. Tunable parallel resonant circuit PRC1 receives an amplified signal from the input amplifier RFA. Tunable parallel resonant circuit PRC2 transfers an amplified and filtered signal to an input IN of the mixer-oscillator integrated circuit MOIC via a coupling network CNW. The coupling network CNW includes a coupling resistor Rc having a resistance of 1 k$\Omega$ and a coupling capacitor Cc having a capacitance of 3.3 pF. The input IN of the mixer-oscillator integrated circuit MOIC has an input capacitance Ci of, for example, 2,5 pF.

The two tunable parallel resonant circuits PRC1 and PRC2 are mutually coupled by means of two top-coupling capacitors Ct1 and Ct2 and a foot-inductance Lf. The two tunable parallel resonant circuits PRC1 and PRC2 are tuned by means of varicap diodes to which a tuning voltage Vt is applied. The varicaps, which have no reference sign, may be of the type BB133. The function of other elements which have no reference signs will be understood by those skilled in the art. For that reason, it is not necessary to further discuss these elements.

The FIG. 3 receiver includes the following additional features. The coupling capacitance of the coupling capacitor Cc is within an order of magnitude of the input capacitance Ci at the input IN of the mixer-oscillator integrated circuit MOIC. Furthermore, the coupling capacitor Cc and the coupling resistor Rc have substantially equal impedances at a lower end of the VHF-low band throughout which the tunable parallel resonant circuit PRC2 can be tuned. These additional features have contributed to a satisfactory performance of the FIG. 3 receiver, despite the fact that the coupling network CNW lacks a varicap diode.

The Table below illustrates the operation of the coupling network CNW in the FIG. 3 receiver. In the Table, Ftun represents a frequency to which the tunable filter TUF is tuned, Rp represents the resonance-impedance of the tunable filter TUF, Cb represents the bridging capacitance between the tunable parallel resonant circuit PRC2 and the input IN of the mixer-oscillator circuit MOIC, as provided by the coupling network CNW, and Rg represents a source impedance "seen" by the mixer-oscillator integrated circuit MOIC at its input IN.

| Ftun (MHz) | Rp (k$\Omega$) | Cb(pF) | Rg($\Omega$) |
| --- | --- | --- | --- |
| 50 | 1 | 1.59 | 151 |
| 100 | 4 | 0.622 | 159 |
| 150 | 9 | 0.308 | 108 |

The Table clearly shows that, although the resonance impedance Rp of the tunable filter TUF changes drastically with frequency, it is transformed down to an almost constant source impedance Rg by the coupling network CNW. As a result, a satisfactory signal handling is obtained. In particular, it allows the FIG. 3 receiver to have a gain which is substantially constant throughout the VHF-low band in which it can be tuned.

The drawings and their description hereinbefore, illustrate rather than limit the invention. Evidently, there are numerous alternatives which fall within the scope of the appended claims. In this respect, the following closing remarks are made.

There are numerous ways of physically spreading functions or functional elements over various units. In this respect, the drawings are very diagrammatic, each representing only one possible embodiment of the invention.

The coupling network CNW may comprise elements in addition to the coupling capacitor Cc and the coupling resistor Rc shown in the drawings, for example, it may comprise an additional coupling capacitor coupled in parallel with the coupling capacitor Cc and the coupling resistor Rc. All that matters is that the bridging capacitance Cb, shown in FIG. 1b, has a capacitance which varies as a function of frequency. In this respect, additional elements may improve the manner in which the capacitance varies as a function of frequency and, as a result, they may improve the signal handling.

While the invention can be used to great advantage in television receivers, particularly by their VHF-low band circuitry, applications in other types of receivers are by no means excluded.

What is claimed is:

1. A receiver comprising a tunable parallel resonant circuit which is coupled to an input of a transistor circuit via a coupling network including a coupling capacitor, wherein the coupling network lacks a varicap diode but includes a coupling resistor which is coupled in series with the coupling capacitor, characterized in that the coupling capacitor has a coupling capacitance which is within an order of magnitude of an input capacitance at the input of the transistor circuit, and in that the coupling capacitor and the coupling resistor have substantially equal impedances at a lower end of a frequency range throughout which the tunable parallel resonant circuit is tunable.

* * * * *